US009095061B2

(12) United States Patent
Coberly

(10) Patent No.: US 9,095,061 B2
(45) Date of Patent: Jul. 28, 2015

(54) ARTICULATING PANEL

(71) Applicant: Isaiah Coberly, Lakewood, WA (US)

(72) Inventor: Isaiah Coberly, Lakewood, WA (US)

(*) Notice: Subject to any disclaimer, the term of this patent is extended or adjusted under 35 U.S.C. 154(b) by 276 days.

(21) Appl. No.: 13/737,727

(22) Filed: Jan. 9, 2013

(65) Prior Publication Data
US 2013/0175423 A1    Jul. 11, 2013

Related U.S. Application Data

(60) Provisional application No. 61/584,591, filed on Jan. 9, 2012.

(51) Int. Cl.
F16M 11/00 (2006.01)
H05K 5/03 (2006.01)
F16M 11/20 (2006.01)
F16M 11/10 (2006.01)
F16M 11/38 (2006.01)
F16M 13/00 (2006.01)

(52) U.S. Cl.
CPC ............ H05K 5/03 (2013.01); F16M 11/10 (2013.01); F16M 11/2035 (2013.01); F16M 11/38 (2013.01); F16M 13/00 (2013.01)

(58) Field of Classification Search
USPC ......... 248/688, 174, 152, 459, 682; D14/447; 206/45.23
See application file for complete search history.

(56) References Cited

U.S. PATENT DOCUMENTS

| | | | | |
|---|---|---|---|---|
| 3,210,874 A * | 10/1965 | Nichols | ............ | 40/120 |
| 4,722,504 A * | 2/1988 | Degenholtz | ............ | 248/459 |
| 5,755,423 A * | 5/1998 | Michela | ............ | 248/459 |
| 6,269,961 B1 * | 8/2001 | Porcelli | ............ | 211/70.7 |
| D669,085 S * | 10/2012 | Coberly | ............ | D14/447 |
| 8,424,829 B2 * | 4/2013 | Lu et al. | ............ | 248/371 |
| 8,424,830 B2 * | 4/2013 | Yang et al. | ............ | 248/459 |
| D718,771 S * | 12/2014 | Huang | ............ | D14/447 |
| 2004/0135052 A1 * | 7/2004 | Hecker | ............ | 248/459 |
| 2006/0285283 A1 * | 12/2006 | Simonian et al. | ............ | 361/679 |
| 2012/0194448 A1 * | 8/2012 | Rothkopf | ............ | 345/173 |
| 2012/0211613 A1 * | 8/2012 | Yang et al. | ............ | 248/174 |
| 2013/0043148 A1 * | 2/2013 | Chen et al. | ............ | 206/45.23 |
| 2013/0048517 A1 * | 2/2013 | Mecchella | ............ | 206/216 |
| 2013/0146482 A1 * | 6/2013 | Huang | ............ | 206/45.23 |
| 2013/0258586 A1 * | 10/2013 | Shao et al. | ............ | 361/679.55 |
| 2013/0264459 A1 * | 10/2013 | McCosh et al. | ............ | 248/688 |
| 2014/0284228 A1 * | 9/2014 | Chiou | ............ | 206/45.23 |

* cited by examiner

Primary Examiner — Bradley Duckworth
(74) Attorney, Agent, or Firm — Maschoff Brennan

(57) ABSTRACT

An articulated panel that provides both a cover and a support structure for an object, such as a slate computing device, is disclosed. The articulated panel may be converted from a flat position to a folding position that may serve as a support structure. The support structure may be fluidly adjusted into many different standing positions; both portrait and landscape. When the articulated panel is in the folded position, the supported object is sturdy in all provided positions. Two pyramid-based structures and an internal joint at a junction therebetween make this possible. An inversion pulled into one of these pyramid structures by a tether provides both automatic folding as well as additional stability in the support structure.

20 Claims, 10 Drawing Sheets

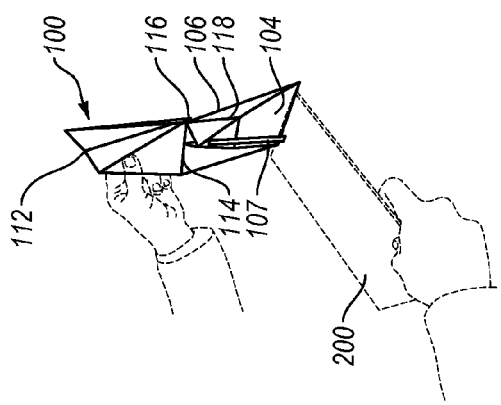
*Fig. 2C*
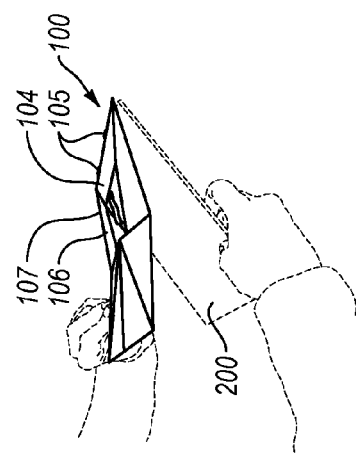
*Fig. 2B*
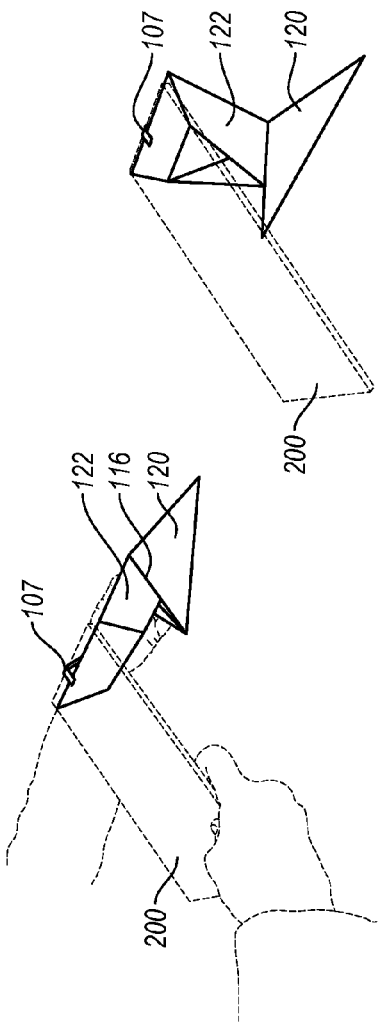
*Fig. 2F*
*Fig. 2E*
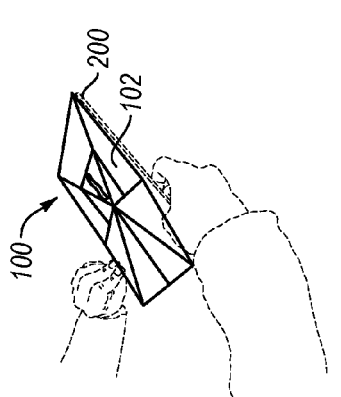
*Fig. 2A*
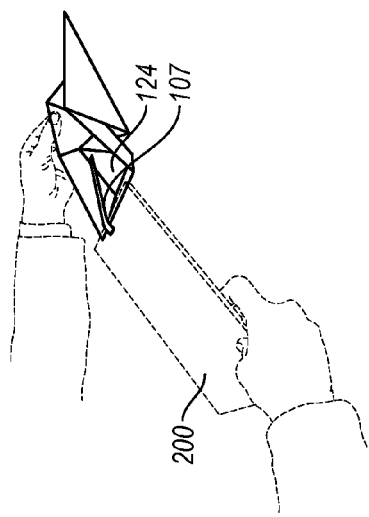
*Fig. 2D*

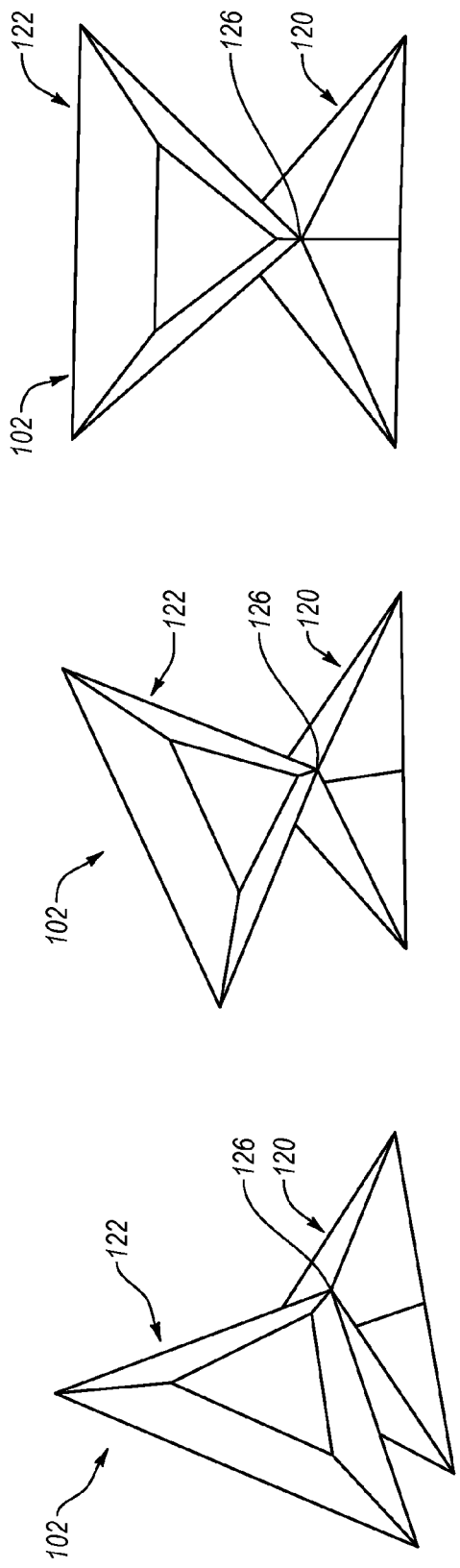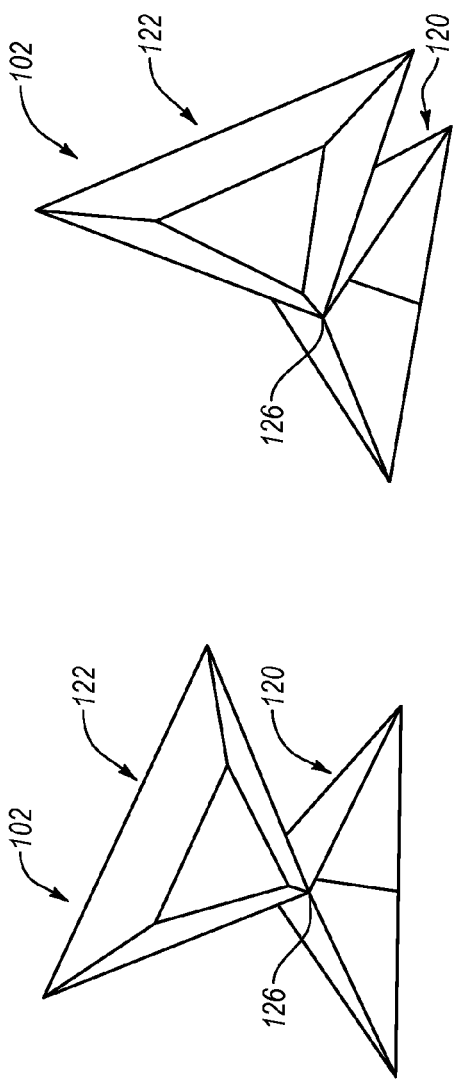

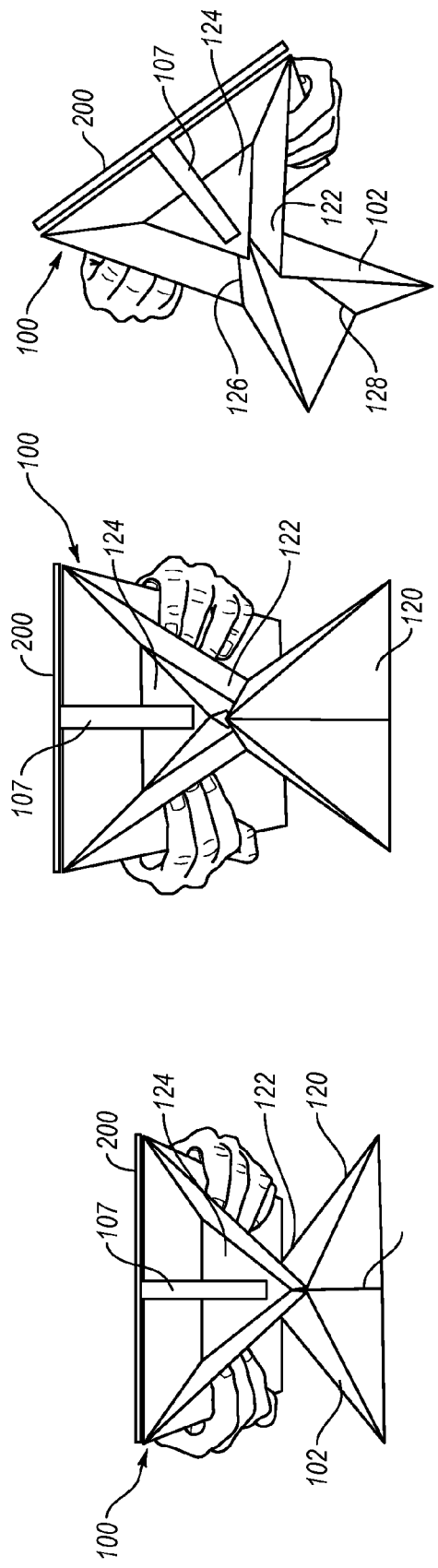
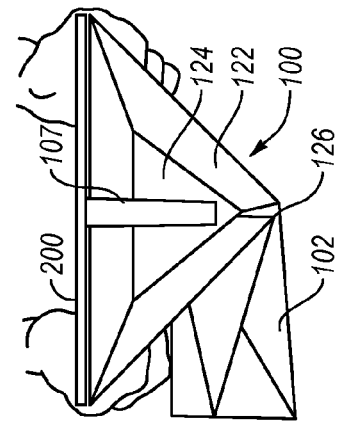
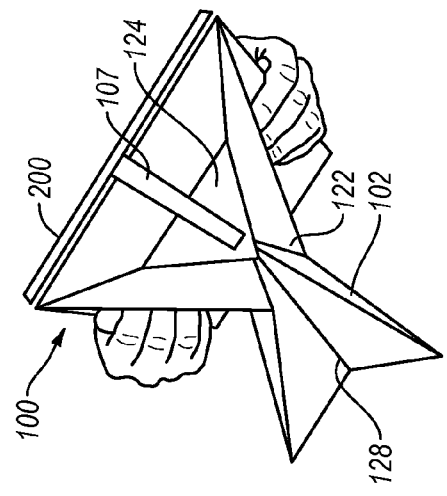
Fig. 8A
Fig. 8B
Fig. 8C
Fig. 8D
Fig. 8E

ARTICULATING PANEL

CROSS-REFERENCE TO RELATED APPLICATION

This patent application claims priority to U.S. Provisional Patent Application No. 61/584,591, filed Jan. 9, 2012, which is incorporated herein by reference.

BACKGROUND

Stands are useful to display articles for aesthetic reasons or support articles to increase their accessibility or provide hands-free use. Conventional stands are three-dimensional (3D) objects having a substantial thickness in three (3) planes (e.g., a substantial length, width, and height). Thus, such stands consume space and are difficult to carry, transport, and store. In addition, such stands do not enable the position of the article to be easily adjusted.

For example, stands are a popular accessory for consumer-oriented electronic products (e.g., smartphones, tablet computers, mobile phones, PDAs (Personal Digital Assistants), etc.). While such stands are useful, they often add bulk and are not compact, adjustable, and/or portable.

SUMMARY

The technologies described herein generally relate to an articulating panel that may be used as a combination cover and stand for an article, such as an electronic device.

In some examples, an articulated panel, including a plurality of joints and at least one opening, configured to enable the articulated panel to move between an open position and folded position is disclosed. The folded position includes at least two pyramid-shaped structures, each having three sides. The plurality of joints may include seven (7) joints extending radially from a point at or near a center of the articulated panel, two of the joints converging with a single opening extending in opposite directions from the center at an angle with respect to a plane of first sides of the articulating panel and three internal joints, a first internal joint positioned between a center, and one of the first sides of the articulating panel and second internal joints extending from terminus of the single opening to terminus of the first internal joint. The second internal joints may be positioned at an angle with respect to a plane of second sides opposite the first sides of the articulating panel.

In some examples, an articulated panel including a plurality of joints and an opening configured to fold into a support structure is disclosed. The support structure includes a first triangle-based pyramid, a second triangle-based pyramid having a truncated apex and having a common edge with the first triangle-based pyramid to enable movement between the first and second triangle-based pyramids, and a third triangle-based pyramid formed from an inverted apex of the second triangle-based pyramid, the second triangle-based pyramid within the first triangle-based pyramid and having substantially smaller dimensions than the first triangle-based pyramid.

In some examples, a combination cover and support structure for an object is disclosed. The combination cover and stand may include an articulated panel comprising a plurality of hingedly-coupled panels configured to enable the panel to fold into at least two pyramid-shaped structures, each having a three-sided base and at least one fastener for securing the articulated panel to an object. The at least two pyramid-shaped structures may include a first triangle-based pyramid, a second triangle-based pyramid having a common edge with the first triangle-based pyramid to form a joint therebetween, and a third triangle-based pyramid disposed within and inverted with respect to the second triangle-based pyramid.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

In the drawings:

FIGS. 2A through 2F are perspective views of the unit and illustrate transition of the articulating panel from the open position of FIGS. 1A and 1C into the folded position of FIG. 1B;

FIGS. 7A through 7E are perspective views of the articulating panel in the folded position and illustrate transition of the articulating panel from a first configuration in the folded position to a second configuration in the folded position;

FIGS. 8A through 8E are perspective views of the unit attached to the device and illustrate transition of the articulating panel from a mid-profile to a low-profile;

DETAILED DESCRIPTION

Figure 1C:
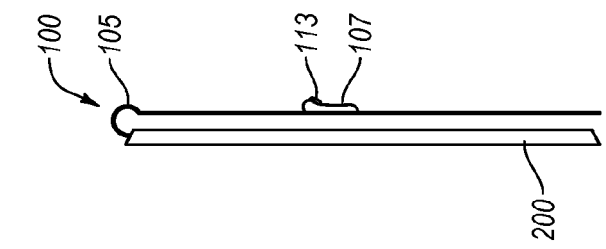
FIG. 1C is a side view showing the unit of FIG. 1A attached to the device and including the articulating panel in the open position.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

The disclosure generally relates to an articulating panel that may be converted into a multitude of positions, such as a support structure. More particularly, the articulating panel may include a network of joints that enables its configuration into a support structure for use with any object for which support is desired (e.g., a portable electronic device, a picture frame, jewelry stand, solar panel, store displays, candy box, etc.). The articulating panel may automatically fold to form the support structure and may be readily adjustable to enable the supported object to be moved into various positions.

Figure 1B:
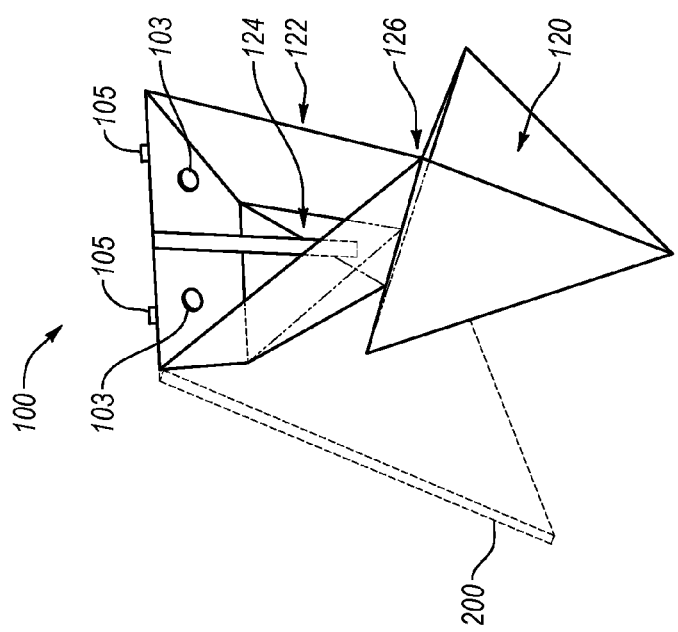
FIG. 1B is a perspective view showing the unit of FIG. 1A attached to a device and including the articulating panel in a folded position.
Figure 1A:
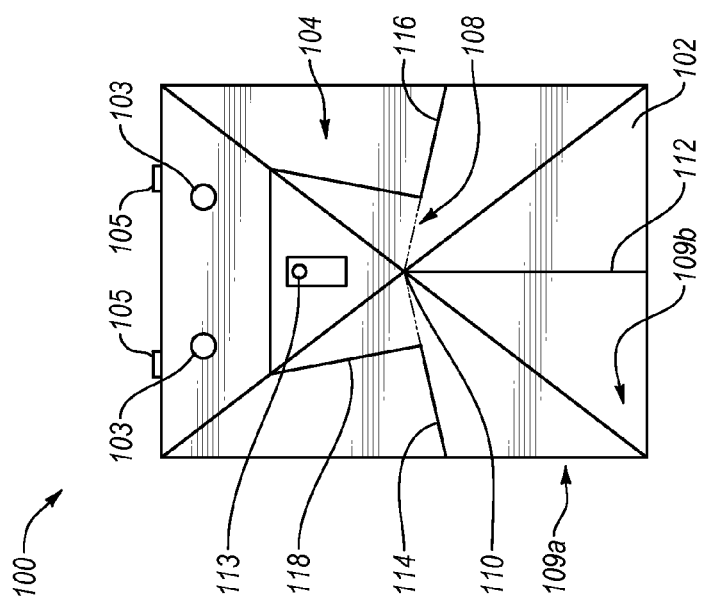
FIG. 1A is a top down view illustrating an embodiment of a unit including an articulating panel in an open position.

FIGS. 1A through 1C illustrate a unit 100 including an articulating panel 102 that may be used as a combination of a cover and a support structure for a portable electronic device or display device 200. The unit 100 may be used with portable and/or slate-style electronic devices, such as tablet computers (e.g., iPad®), smartphones, MP3 players, or other display devices. While the unit 100 is described for use with the device 200, it may also be useful in various other applications in which a support structure is used, such as as a picture frame, jewelry stand, solar panel, store displays, candy box, etc.

Referring to FIG. 1A, the unit 100 that functions as a combination cover and support may include an articulating panel 102, including a plurality of panels 104 with network of joints 106 and/or opening 108 (shown in broken lines) therebetween. The articulating panel 102 may be formed from leather, imitation leather, plastic, rubber, polymeric materials, woven and nonwoven fabrics, etc. By way of example and not limitation, the articulating panel 102 may have a substantially rectangular shape, the dimensions of which are sufficient to cover a surface or display of the device 200.

The articulating panel 102 is shown in a first or open position in which the articulating panel 102 may be easily stored or transported. In the open position, the articulating panel 102 may lie flat against the device 200 and may function, for example, as a cover for a display of an electronic device. A plurality of the joints 106 may be arranged around a point 110 substantially at or near a center of the articulating panel 102. For example, the articulating panel 102 may include first joints 112 extending radially from the point 110 to the outer boundary of the articulating panel 102.

As a non-limiting example, the articulating panel 102 may include about seven (7) first joints 112. Four (4) of the first joints 112 may extend from the point 110 to one of four corners of the articulating panel 102. The first joints 112 may include a first pivot joint 114 and a second pivot joint 116 that align and converge with the opening 108 in the articulating panel 102. The opening 108 extends in opposite direction from the point 110 and terminates at the first and second pivot joints 114 and 116. The first and second pivot joints 114 and 116 extend to the outer boundary of first sides of the articulating panel 102. The opening 108 and the first and second pivot joints 114 and 116 are positioned at an angle of between about 8 degrees and about 16 degrees and, more particularly, between about 10.5 degrees and about 13.5 degrees and, more particularly, about 12 degrees, with respect to a plane of second (i.e., top and bottom) sides of the articulating panel 102 opposite the first sides. Another of the first joints 112 may extend from the point 110 to a midpoint of the edge on one of the second sides of the articulating panel 102.

The articulating panel 102 may also include second joints 118 that extend between two of the first joints 112. For example, the articulating panel 102 may include three (3) internal second joints 118. One of the second joints 118 may be positioned substantially parallel to the second (i.e., top and bottom) sides of the articulating panel 102, and may be positioned on a side of the opening 108 above the tension strap 107. Two of the second joints 118 may extend from ends of the one of the second joints 118 to opposite ends of the opening 108 at an angle of between about 6 degrees and about 14 degrees and, more particularly, between about 8 degrees and about 12 degrees and, more particularly, about 10 degrees, with respect to a plane of the first sides of the articulating panel 102.

The unit 100 may include an attachment mechanism, such as a strap, a brace, an encasement, hinge(s), and/or magnet(s), configured to removably attach the articulating panel 102 to the device 200. For example, the unit 100 may include hinges 105 configured to enable the articulating panel 102 to be rotated about one of the sides of the device 200, and fasteners 103 configured to releasably attach to the device 100. One or more tethers, such as tension strap 107, may be removably fastened to the articulating panel 102. For example, the tension strap 107 may extend from a first side 109a of the articulating panel 102 through an aperture 111 in the articulating panel 102 to a second side 109b opposite the first side 109a. The tension strap 107 may be fastened to the second side 109b of the articulating panel 102 by a fastener 113, such as a snap.

In the open position shown in FIG. 1C, the articulating panel 102 may be positioned in a variety of ways, such as within a case or flat against a surface of the device 200. The articulating panel 102 may be sufficiently thin to enable it to be positioned out of the way of a user. By way of example and not limitation, the articulating panel 102 may overlie a screen, display, or keyboard of the device while in the flat position, as shown in FIG. 1C. In embodiments in which the articulating panel overlies a surface of the device, the articulating panel may function as a protective cover. The articulating panel 102 is fixed by the hinges 105 to the device 200 or mechanism for attaching the device to the unit (e.g., the encasement) along one of the outermost edges of the articulating panel.

FIG. 1B illustrates the unit 100 with the articulating panel 102 in the folded position in which the unit 100 functions as a support structure for the device 200. The unit 100 may be moved between the open position (FIG. 1A) to the folded position in a single motion. For example, the articulating panel 102 may be rotatably attached to the attachment mechanism (e.g., a brace) or the device 200 itself to enable the articulating panel 102 to be moved from a first side of the device 200 (e.g., the front or display side of the device) to a second, opposite side of the device 200 (e.g., the back side of the device). For example, the unit 100 may be rotatably attached to the attachment mechanism or the device 200 by the hinges 105.

As the articulating panel 102 is rotated about the hinges 105, the tension strap 107 applies force that pulls the panels 104 out at the opening 108 such that the articulating panel 102 is pulled into the folded position. The joints 106 and opening 108 enable the articulating panel 102 to fold into the folded position that includes pyramid-shaped structures 120, 122, and 124. The first and second pivot joints 114 and 116 come together to form a first pyramid-shaped structure 120 and a second pyramid-shaped structure 122. The first and second pyramid-shaped structures 120 and 122 share a common boundary (i.e., an edge between triangular sides) that functions as a single pivot point 126 between the first and second pyramid-shaped structures 120 and 122.

Exposed sides of the panels 104 at the opening 108 on a side adjacent the tension strap 107 come together to form an edge of a third pyramid-shaped structure 124 positioned substantially within the second pyramid-shaped structure 122. As the apex of the third pyramid-shaped structure 124 is pulled by the tension strap 107, the apex of the second pyramid-shaped structure 122 is truncated. Exposed sides of the panels 104 at the opening 108 on a side opposite the tension strap 107 come together to form an edge of the first pyramid-shaped structure 120 that extends from the pivot point 126 between the first and second pyramid-shaped structures 120 and 122.

Each of the pyramid-shaped structures 120, 122, and 124 may be, for example, a three-sided, triangle-based structure as shown in FIG. 1B. The pyramid-shaped structures 120, 122, and 124 each have three triangular-shaped sides, and may be substantially asymmetrical or symmetrical. The first and second pyramid-shaped structures 120 and 122 may be pivoted with respect to one another enabling the articulating panel 102 to be manipulated into a variety of configurations in the folded position.

While the articulating panel is shown in FIGS. 1A through 1C as part of the unit that is used to support a device, the articulating panel may be used in various other applications, or by itself, as a support structure.

FIG. 1C shows the unit 100 with the articulating panel 102 in the open position overlying a surface of the device 200. The articulating panel 102 may be moved from the folded position (FIG. 1B) to the open position by rotating the articulating panel 102 about the top of the device 200, or by releasing the tension strap 107.

As shown in FIGS. 2A through 2F, the unit 100 may be converted from the flat position to the folded position by moving the articulating panel 102 from the first side of the device to the second, opposite side of the device 200. For example, the articulating panel 102 may be moved about an axis of rotation from the front side to the back side of the device 200. As a non-limiting example, the hinges 105 may be used to provide movement about the axis of rotation. For example, if a user wishes to use the unit 100 as a support structure, the user may move the articulating panel 102 around the top of the device 200, which may be performed quickly and fluidly by picking up the articulating panel 102 and rotating it to the other side or by holding the device 200 and flipping the wrists to send the articulating panel 102 to the other side.

FIG. 2A shows the unit 100 attached to the device 200 and having the articulating panel 102 in the open position lying flat over a display of the device 200.

As shown in FIGS. 2B and 2C, as the articulated panel 102 is lifted away from the device 200, the articulated panel 102 folds at the joints 106 between the panels 104 as tension is created by the tension strap 107. The articulating panel 102 begins to fold at the first and second pivot joints 114 and 116 as the panels 104 on one side of the opening 108 adjacent the tension strap 107 are pulled in a direction opposite the panels 104 on the other side of the opening 108.

Referring to FIG. 2D, as the panels 104 adjacent the tension strap 107 are pulled together, the apex of the third pyramid-shaped structure 124 is formed within the second pyramid-shaped structure 122. As the folding continues, the apex is pulled inward such that the smaller, second pyramid-shaped structure 122 is truncated after the articulated panel is folded, as shown in FIG. 2E.

Referring to FIG. 2F, in the folded position, the articulated panel 102 may include the first pyramid-shaped structure 120, the second pyramid-shaped structure 122 having a common edge with the first pyramid-shaped structure 120 and having a truncated apex, and the third pyramid-shaped structure 124 formed from panels that invert to truncate the apex of the second pyramid-shaped structure 122. The third pyramid-shaped structure 124 is positioned within the second pyramid-shaped structure 122 and has substantially smaller dimensions than the first and second pyramid-shaped structures 120 and 122. The common edge shared by the first and second pyramid-shaped structures 120 and 122 enables movement of the first and second pyramid-shaped structures 120 and 122 with respect to one another.

By way of example and not limitation, the device 200 to which the unit 100 is removably secured may have a rectangular shape having two sides longer than the adjacent sides. Thus, the device 200 may include a portrait viewing angle wherein the longitudinal axis of the device 200 is oriented substantially perpendicularly to the axis of rotation of the hinges 105 of the unit 100 and a landscape viewing angle wherein the longitudinal axis of the device 200 is oriented substantially parallel to the axis of rotation of the hinges 105 of the unit 100.

FIG. 2F illustrates the unit 100 in a first folded position in which the device is in the portrait viewing angle at a mid-angled viewing position. In the so-called "mid-angle" position, the device is oriented at an angle of about 45 degrees with respect to a surface (not shown) on which the device 200 and the unit 100 are placed. The surface may be, for example, a table, a floor, a user's, knee, lap, or chest, etc.

As shown in FIGS. 3A through 3F, the tension strap 107, or other tether(s), may be fastened and released to enable transition of the articulating panel 102 between the open position and the folded position as desired by a user. Releasing the tension strap 107 provides the user with the option to move the articulating panel 102 from first side (e.g., the front) to a second, opposite side (e.g., the back) of the device 200 while remaining in the flat position. A first end 302 of the tension strap 107 may be removably or fixedly attached to at least one region of the articulating panel 102 and a second end 304 of the tension strap 107 may be removably or fixedly attached to a peripheral region of a first side of the device 200 (or the mechanism for attaching the unit to the device). While the tension strap 107 shown in FIGS. 3A through 3F is positioned near the center of the articulating panel 102, the tension strap 107 may be connected to any region of the articulating panel 102 that enables the articulating panel 102 to be pulled in order to cause the articulating panel 102 to fold along the joints 106 therein.

Figure 3A:
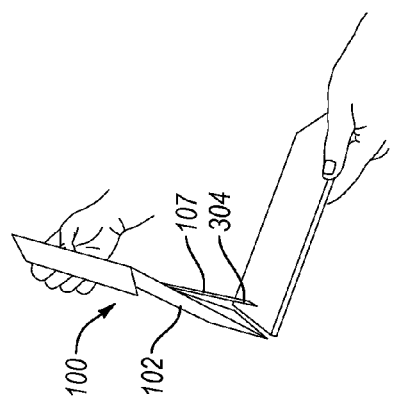
FIGS. 3A through 3F illustrate the transition from the open position overlying a screen of the device to overlying the back of the device for handheld use.
Figure 3B:
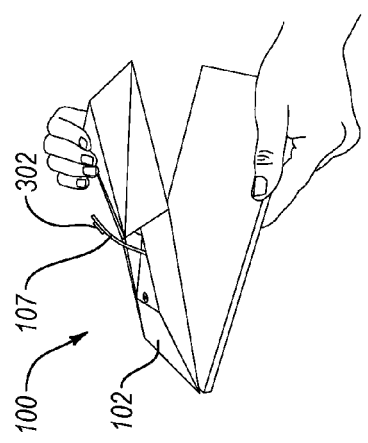
Figure 3C:
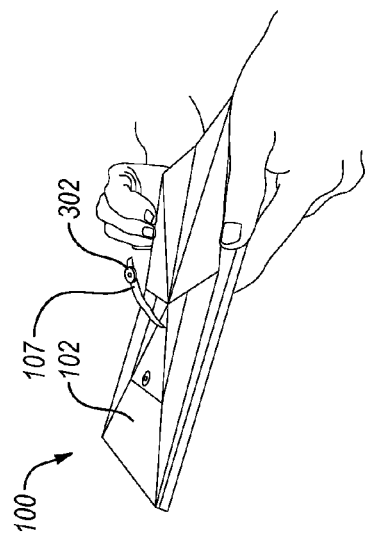
Figure 3D:
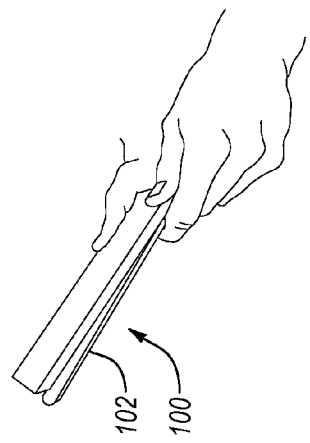
Figure 3E:
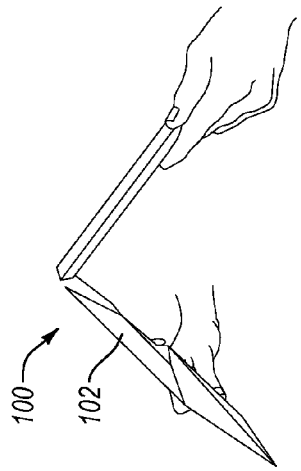
Figure 3F:
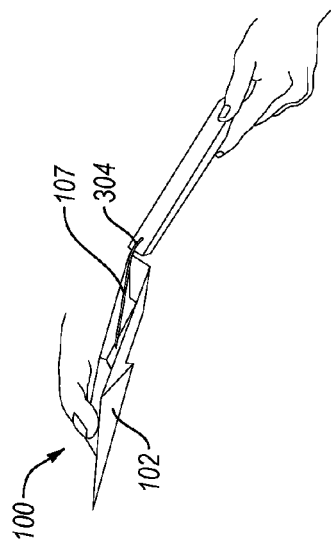

Referring to FIG. 3A, the first end 302 of the tension strap 107 may be disengaged from the articulating panel 102 so that the first end 302 is free and the second end 304 remains attached to the device 200 or the attachment mechanism. For example, the tension strap 107 may be disengaged by releasing the fastener 103 (such as a snap, button, magnet, hook, etc.) that attaches the tension strap 107 to the device 200. Alternatively, the second end 304 of the tension strap 107 may be free and the first end 302 may remain attached to the articulating panel 102. The articulating panel 102 may be rotated about the top of the device 200, as shown in FIG. 3B. The first end 302 is free to move through the aperture 111 in the articulating panel 102, which enables the articulating panel 102 to be rotated without folding into the folded position, as shown in FIGS. 3C through 3E. As shown in FIG. 3F, the articulated panel 102 may be placed against a back surface of the device 200 in the flat position, if desired by the user, by simply releasing one end of the tension strap 107.

While the unit described with respect to FIGS. 3A through 3F includes a tether (e.g., the tension strap) for pulling the articulating panel into the folded position, the folded position may be achieved in various other ways. This makes it possible to use the unit 100 for handheld computing or have it lay flat on a surface. As a non-limiting example, if the unit 100 includes magnets (not shown), the magnets may be used to attach the unit 100 to, for example, a refrigerator, a filing cabinet, or other metal surface. The magnets may be those used to assist in stabilization of the engaged mode (as discussed with respect to FIGS. 3A through 3F). When disengaged, the articulating panel 102 of the unit 100 may be secured between the headrest and back of a chair (such as in a car seat) to provide optimal viewing for backseat riders or users seated behind the chair. As a non-limiting example, a user may simply fold the articulating panel 102 into the folded position using their hands.

In some embodiments, one or more magnets, ferromagnetic materials (e.g., metal), or fasteners (such as snaps, buttons or VELCRO) may optionally be included in the unit 100 to provide further stabilization of the unit in the open or folded position or to secure the articulating panel 102 to the device 200.

Figure 4A:
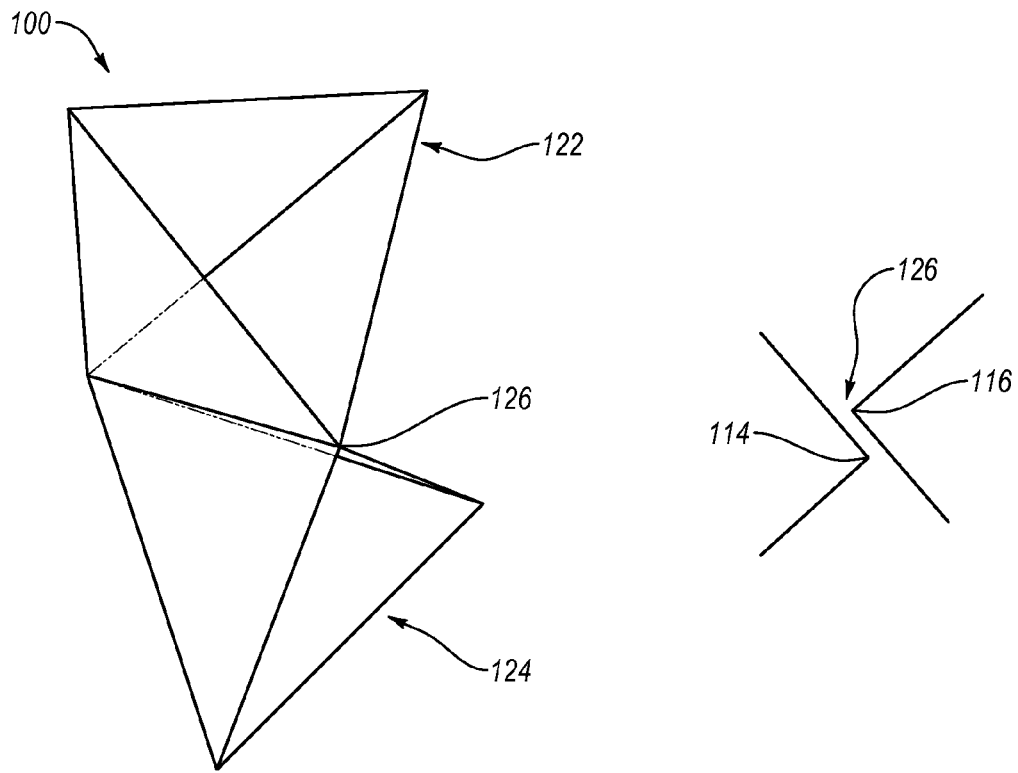
FIGS. 4A and 4B are perspective views of a section of the articulating panel including a pivot point in the folded position.
Figure 4B:
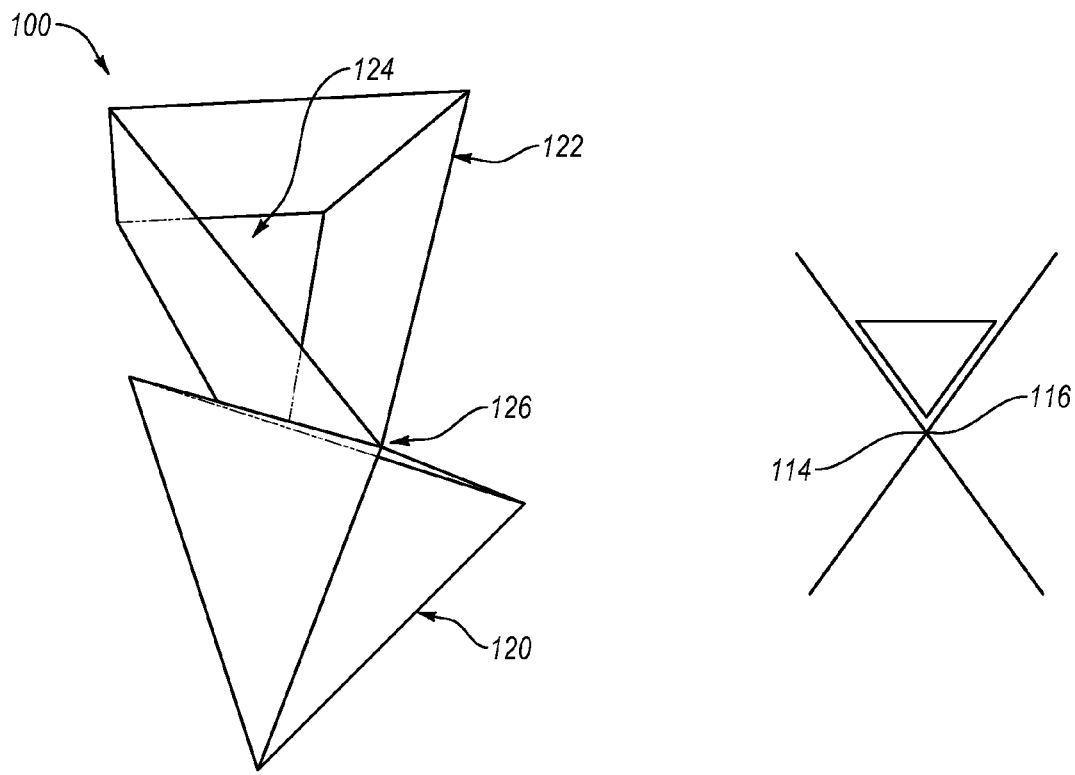

FIGS. 4A and 4B illustrate how the jointed panels of the articulating panel form a support structure that prevents the first and second pyramid-shaped structures 120 and 122 from slipping to stabilize the pivot point 126 between them. The pivot point 126 between the pyramid-shaped structures forms an internal joint at the junction of the first and second pyramid-shaped structures 120 and 122 to provide side-to-side movement enabling manipulation into different positions, as will be described in further detail. The unit 100, thus, provides both automatic folding and support to keep the internal joint in the proper position as an aid in supporting articles, such as the device 200.

Referring to FIG. 4A, the first and second pyramid-shaped structures 120 and 122 are shown without the third pyramid-shaped structure 124. FIG. 4A1 is an enlarged view of the area designated in FIG. 4A and shows that the sides of the pivot point 126 formed by the first and second pivot joints 114 and 116 may slip or become misaligned in the absence of the third pyramid-shaped structure 124.

As shown in FIG. 4B, the third pyramid-shaped structure 124 formed by inversion of the apex of the second pyramid-shaped structure 122 nests within the second pyramid-shaped structure 122 such that the adjacent sides of the second pyramid-shaped structure 122 are stabilized against the third pyramid-shaped structure 124. FIG. 4B1 is an enlarged view of the area designated in FIG. 4B and shows that the sides of the second pyramid-shaped structure 122 are prevented from lateral movement by the third pyramid-shaped structure 124 nested therein.

FIGS. 5A through 5D are side perspective views of the articulating panel 102 illustrating transition of the articulating panel 102 from the flat position to the folded position to form the support structure for supporting the device 200 in the portrait viewing angle.

Figure 5B:
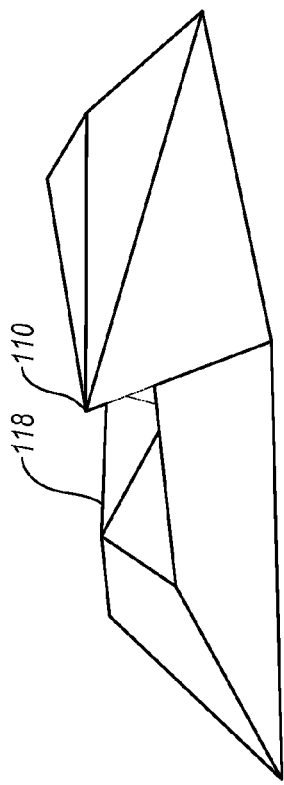
FIGS. 5A through 5D are side perspective views illustrating transition of the articulating panel from the open position to the folded position.
Figure 5D:
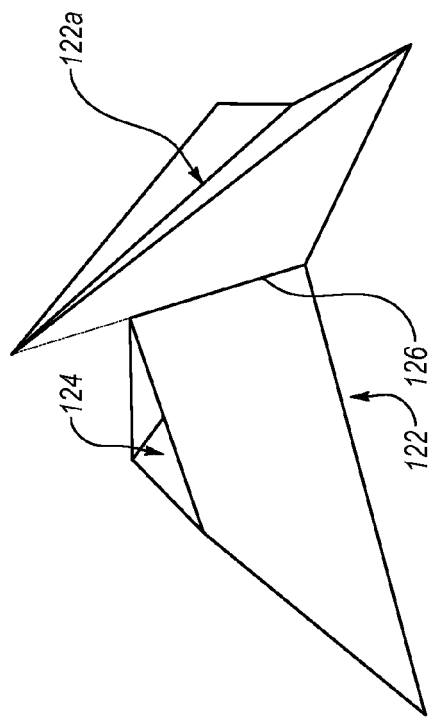
Figure 5A:
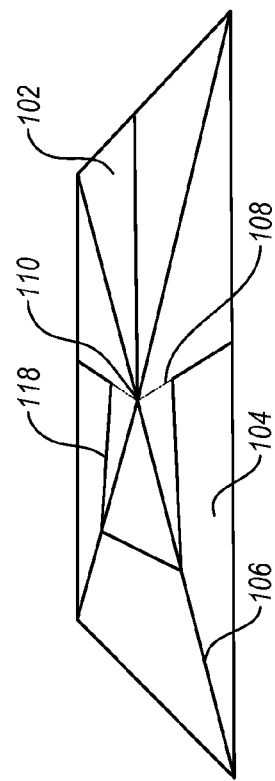

FIG. 5A shows the articulating panel 102 in the flat position in which the panels 104 between joints 106 and opening 108 lie flat next to one another. As shown in FIG. 5B, the articulated panel 102 may be folded such that the panels 104 on opposite sides of the opening 108 are separated in different directions from the point 110, bending at the first joints 112 and the second joints 118.

Figure 5C:
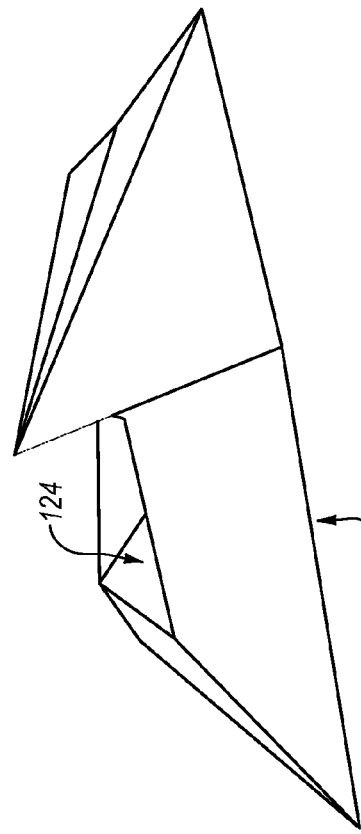
Figure 6B:
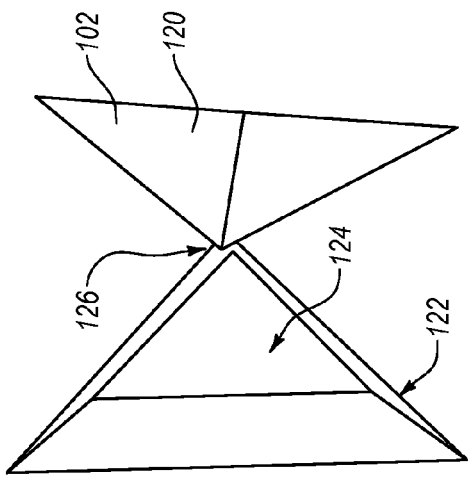
FIGS. 6A through 6D are top down views of the unit shown in FIGS. 5A through 5D.
Figure 6D:
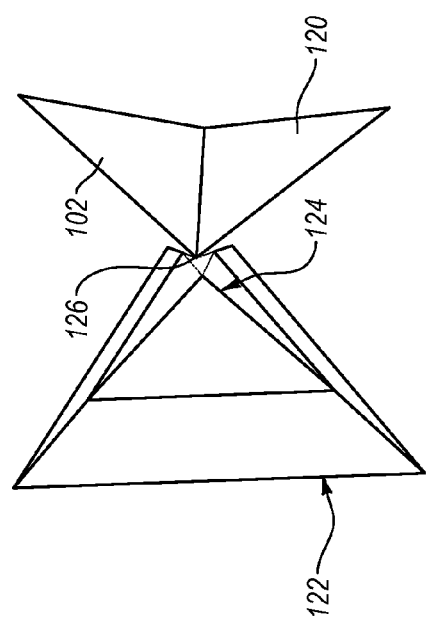
Figure 6A:
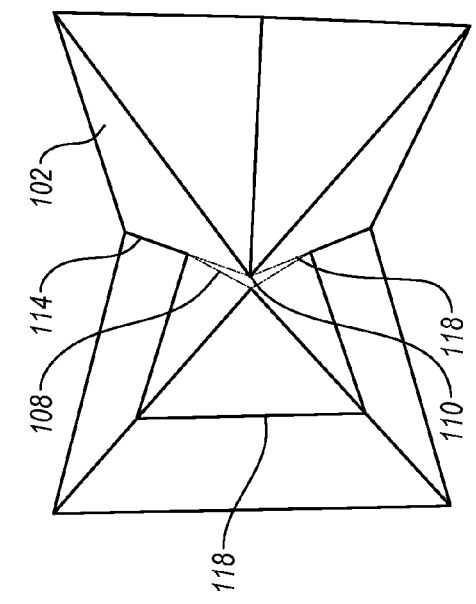
Figure 6C:
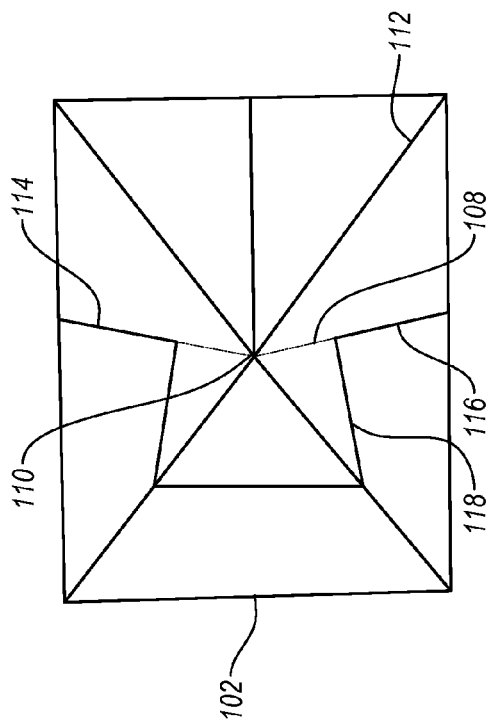

Referring to FIG. 5C, the second joints 118 and the first joints 112 therebetween are folded such that the first pyramid-shaped structure 120 is formed on one side of the pivot point 126, and the third pyramid-shaped structure 124 is formed within the truncated apex of the second pyramid-shaped structure 122 on the opposite side of the pivot point 126. The first pyramid-shaped structure 120 may be used as a base on which the second pyramid-shaped structure 122 is positioned to support an article. The third pyramid-shaped structure 124 supports surfaces of the second pyramid-shaped structure 122 at the pivot point 126 to stabilize the pivot point 126 as discussed with respect to FIGS. 4A through 4B1.

As shown in FIG. 5D, an internal joint 128 may be bent inward to change the positioning and/or height of the base created by the first pyramid-shaped structure 120.

As the articulating panel 102 is rotated into an inverted position, tension on the articulating panel is created by the tension strap as the slack in the tension strap is taken up. This increase in tension on the articulating panel causes the articulating panel to fold along the joints and the opening into the folded position, including the two pyramid-shaped structures. The pyramid-shaped structures of the articulating panel in the folded position may be used as the support structure.

FIGS. 6A through 6D are top down views illustrating the transition of the articulating panel 102 shown in FIGS. 5A through 5D, respectively.

Referring to FIGS. 7A through 7E, the pivot point 126 between the first and second pyramid-shaped structures 120 and 122 enables the unit 100 to be moved side-to-side between a standing or upright position, shown in FIG. 7C, to collapsed positions, shown in FIGS. 7A and 7E. As shown in FIGS. 7B and 7D, the second pyramid-shaped structure 122 may be tilted at the pivot point 126 with respect to the first pyramid-shaped structure 120. The pivot point 126 created at the junction of the first and second pyramid-shaped structures 120 and 122 enables the second pyramid-shaped structure 122 to be tilted to either the left side (FIG. 7B) or the right side (FIG. 7D). As the second pyramid-shaped structure 122 is tilted, a top surface 130 of the second pyramid-shaped structure 122 may rotate approximate 90 degrees such that the article secured thereto may also rotate.

As shown in FIGS. 7A and 7E, the second pyramid-shaped structure 122 may be tilted, for example, until a surface of the second pyramid-shaped structure 122 is adjacent to or in contact with an opposing surface of the first pyramid-shaped structure 120.

The second pyramid-shaped structure 122 may be moved about the pivot point 126 to rotate the device (not shown) about 90 degrees from the portrait viewing angle (FIG. 7C) into the landscape viewing angle (FIGS. 7A and 7E). As shown in FIGS. 7B and 7D, the upper pyramid-shaped structure may be tilted to the left or to the right about the pivot point 126 to transition the unit 100 from the upright position (FIG. 7C), in which the device 200 is oriented in the portrait viewing angle, to the collapsed configuration (FIGS. 7A and 7E), in which the device 200 is oriented in the landscape viewing angle.

As shown in FIGS. 8A through 8E, if the user prefers to view a screen of the device 200 in a lower viewing position, they simply lift the device 200 and shift the lower geometric structure to the right or left, depending on which side the support structure has been tilted.

Referring to FIG. 8A, the unit 100 is in the upright position shown in FIGS. 5C, 5D, 6C, 6D, and 7C. The unit 100 may be lifted to disengage the junction between the first and second pyramid-shaped structures 120 and 122 at the pivot point 126 by, for example, the user lifting the device 200 secured thereto, as shown in FIG. 8B. As a non-limiting example, a corner or side of the first pyramid-shaped structure 120 may be placed on the surface (not shown), as shown in FIG. 8C. Pressure may be applied to the left or the right side of the unit 100 such that the first pyramid-shaped structure 120 collapses and is pushed to one side of the pivot point 126, as shown in FIG. 8D. The unit 100 may be placed on the surface, as shown in FIG. 8E, such that the device 200 is oriented in a low-profile portrait viewing angle.

The first (i.e., lower) pyramid-shaped structure 120 also includes a unique internal joint 128 on one of its planes that enables it to fold flat and be moved out of the way to make the second (i.e., upper) pyramid-shaped structure 122 the primary support. Thus, the user doesn't actually have to touch the support structure; they simply use the surface they are computing on to push the unit's lower structure to the side. While FIGS. 8A through 8E illustrate the unit 100 being shifted from a mid-profile to low-profile in the portrait viewing angle, the unit 100 may be similarly shifted to the landscape viewing angle.

Figure 9A:
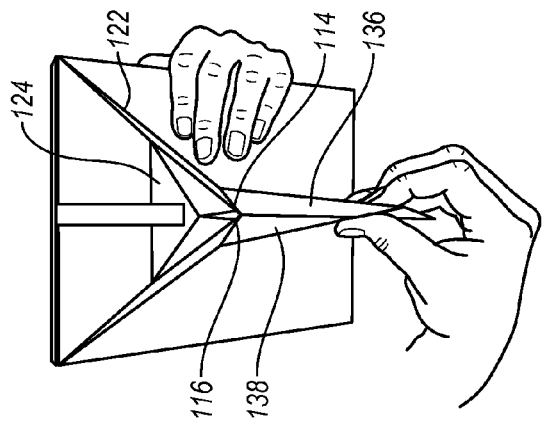
FIGS. 9A through 9E are perspective views of the unit attached to the device and illustrate transition of the articulating panel from a mid-profile to a low-profile.
Figure 9B:
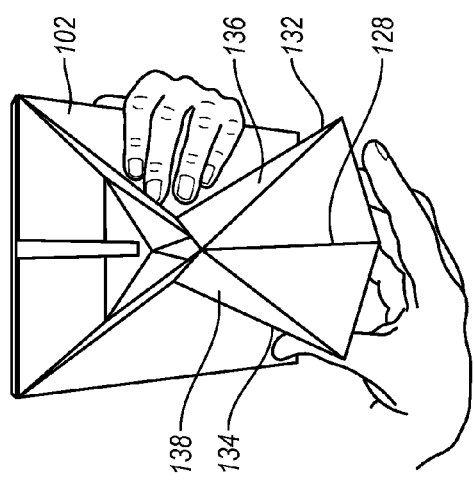
Figure 9C:
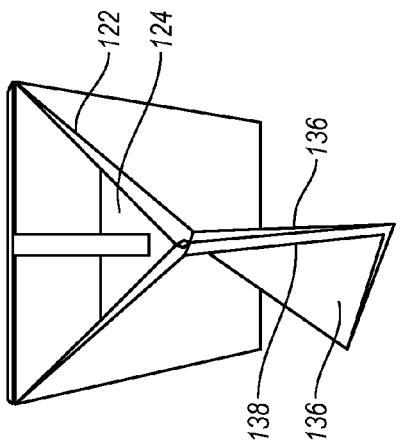
Figure 9D:
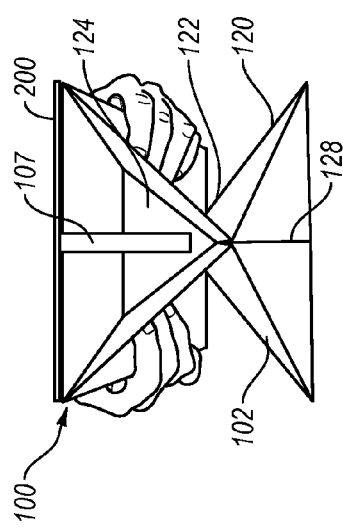
Figure 9E:
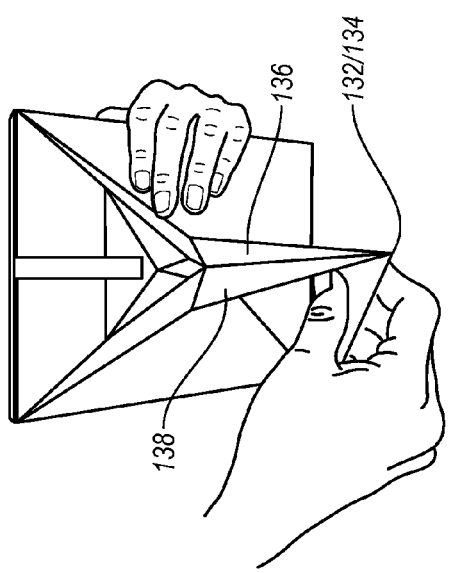
Figure 10A:
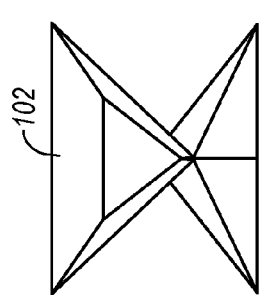
FIGS. 10A through 10F illustrate examples of various configurations of the articulating panel in the folded position.
Figure 10B:
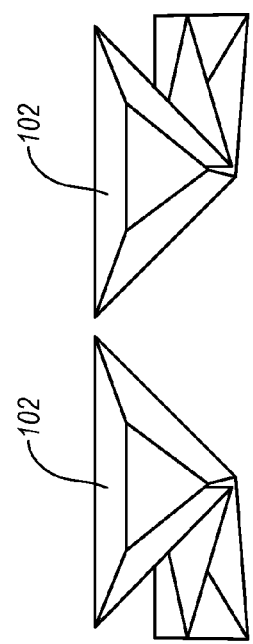
Figure 10C:
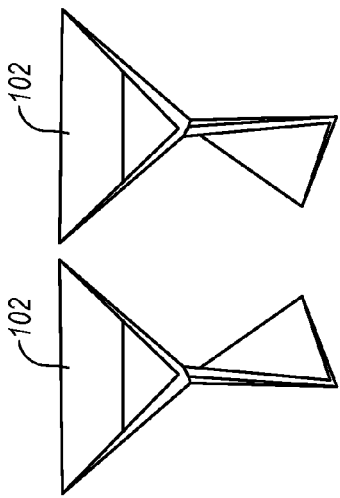
Figure 10D:
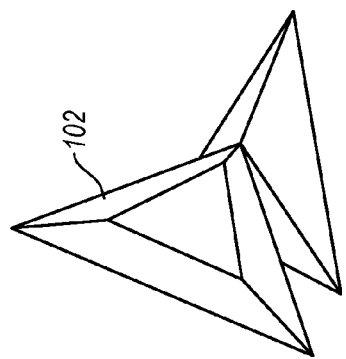
Figure 10E:
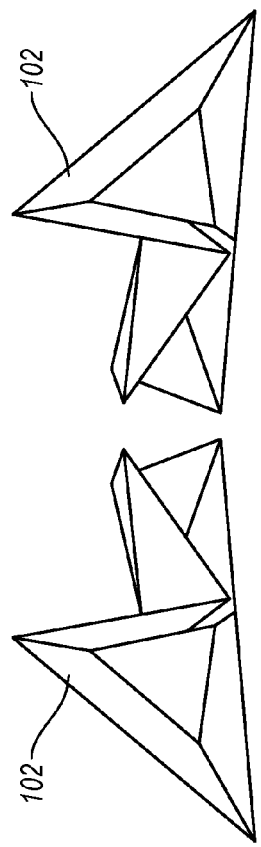
Figure 10F:
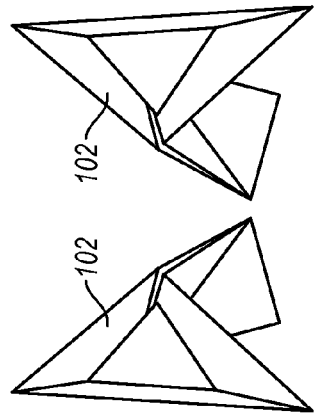

As shown in FIGS. 9A through 9E, if a higher viewing plane is desired, the user may simply collapse the first pyramid-shaped structure 120 and fold it toward the second pyramid-shaped structure 122. Referring to FIG. 9A, the unit 100 is in the upright position shown in FIGS. 5C, 5D, 6C, 6D, and 7C. As shown in FIG. 9B, the unit 100 may be lifted to disengage the junction between the first and second pyramid-shaped structures 120 and 122 at the pivot point 126. Folding along the internal joint 128 and the joints 132 and 134 may be performed to collapse the first pyramid-shaped structure 120 to bring the panels 136 and 138 toward one another until they are in contact, as shown in FIG. 9C. The joints 132 and 134 may then be used to bend a triangular-shaped section to the left, as shown in FIG. 9D, or to the right (not shown).

This new shape of the unit will hold the computing device securely in a high pitch landscape viewing angle. The user may also choose to use the device in a high portrait viewing angle by collapsing the lower geometric structure and folding it to the right or left. In this position, the device will securely be supported in a high portrait viewing angle.

When the unit is in the engaged mode, the user can set the device 200 down on a surface in any of a number of orientations provided by the articulating panel 102, a non-exhaustive representation of examples of which are shown in FIGS. 10A through 10F.

The unit 100 may also be used in a number of other ways. For example, the first (i.e., lower) pyramid-shaped structure 120 may be folded and placed in a cup holder (such as those offered in an automobile). The unit 100 provides a combination cover and support structure that may be easily and fluidly adjusted to provide various orientations (e.g., landscape and portrait viewing angles) of the attached device. The unit 100 provides many movement options that can be performed without the user touching the unit. The unit, therefore, provides hands-free manipulation by enabling the user to merely adjust the device to suit their needs causing the support structure to automatically adjust via the joints therein.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. An articulated panel comprising:
    seven joints extending radially from a point, two of the joints converging with an opening extending from the point; and
    three internal joints, including:
        a first internal joint positioned between the point and a first side of the articulated panel; and
        second internal joints extending from terminus of the opening to terminus of the first internal joint,
    wherein the articulated panel is configured to move between an open position and a folded position, the folded position comprising at least two pyramid-shaped structures, each having three sides.

2. The articulated panel of claim 1, wherein the articulated panel is configured to fold into three pyramid-shaped structures, a first pyramid-shaped structure sharing at least one edge with a second pyramid-shaped structure, and a third pyramid-shaped structure positioned within the second pyramid-shaped structure.

3. The articulated panel of claim 2, wherein the third pyramid-shaped structure is inverted with respect to the first and second pyramid-shaped structures and is configured to nest within a corner of the second pyramid-shaped structure.

4. The articulated panel of claim 1, wherein the at least two pyramid-shaped structures share a common edge forming a pivot point therebetween.

5. The articulated panel of claim 4, wherein a side of one of the pyramid-shaped structures opposite the pivot point includes a third joint of the seven joints extending radially from the point, the third joint extending from an apex of the one of the pyramid-shaped structures to a midpoint on an edge.

6. The articulated panel of claim 1, wherein an apex of at least one of the at least two pyramids is truncated.

7. The articulated panel of claim 1, wherein the point is located at or near a center of the articulated panel.

8. The articulated panel of claim 1, wherein the articulated panel includes four sides and has a substantially rectangular shape in the open position, the four sides including the first side of the articulated panel.

9. The articulated panel of claim 8, wherein the two joints converging with the opening are not positioned parallel to any of the four sides of the articulated panel in the open position.

10. The articulated panel of claim 8, wherein:
    the first internal joint is further positioned substantially parallel to the first side of the articulated panel; and
    the second internal joints are not positioned parallel to any of the four sides of the articulated panel in the open position.

11. An articulated panel comprising a plurality of joints and an opening configured to fold into a support structure, the support structure comprising:
    a first triangle-based pyramid;
    a second triangle-based pyramid having a truncated apex and having a common edge with the first triangle-based pyramid to enable movement between the first and second triangle-based pyramids; and
    a third triangle-based pyramid formed from an inverted apex of the second triangle-based pyramid, the third triangle-based pyramid within the second triangle-based pyramid having substantially smaller dimensions than the second triangle-based pyramid.

12. The articulated panel of claim 11, wherein the third triangle-based pyramid includes a joint extending across one of its sides to enable it to collapse.

13. The articulated panel of claim 11, wherein the common edge between the first and second triangle-based pyramids forms a pivot point.

14. The articulated panel of claim 11, wherein the third triangle-based pyramid is sized and configured to nest within the second triangle-based pyramid to stabilize the common edge between the first and second triangle-based pyramids.

15. The articulated panel of claim 11, further comprising a tension strap removably attached to a region of the articulating panel that forms a side of the third triangle-based pyramid.

16. The articulated panel of claim 11, wherein two joints of the plurality of joints converge with the opening, and the opening extends in substantially opposite directions from a point near a center of the articulating panel.

17. The articulated panel of claim 11, further comprising a plurality of panels between the joints.

18. A combination cover and support structure for an object, comprising:
- an articulated panel comprising a plurality of hingedly-coupled panels configured to enable the articulated panel to fold into at least two pyramid-shaped structures, each having a three-sided base;
- at least one fastener for securing the articulated panel to an object; and
- at least one tether comprising a tension strap having a first end secured to the fastener and a second end secured to a region of the articulated panel, the at least one tether configured to removably attach at least one region of the articulated panel to the object.

19. The combination cover and support structure of claim 18, wherein the at least two pyramid-shaped structures comprise:
- a first triangle-based pyramid;
- a second triangle-based pyramid having a common edge with the first triangle-based pyramid to form a joint therebetween; and
- a third triangle-based pyramid disposed within and inverted with respect to the second triangle-based pyramid.

20. The combination cover and support structure of claim 18, further comprising at least one hinge configured to rotatably attach the articulated panel to an edge of the object.

* * * * *